United States Patent
Watanabe et al.

(10) Patent No.: US 8,110,867 B2
(45) Date of Patent: Feb. 7, 2012

(54) SEMICONDUCTOR DEVICE AND METHOD OF MANUFACTURING THE SAME

(75) Inventors: Shinichi Watanabe, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 633 days.

(21) Appl. No.: 12/240,246

(22) Filed: Sep. 29, 2008

(65) Prior Publication Data

US 2009/0090964 A1   Apr. 9, 2009

(30) Foreign Application Priority Data

Oct. 5, 2007   (JP) .................................. 2007-262619

(51) Int. Cl.
*H01L 27/115*   (2006.01)
*H01L 21/336*   (2006.01)

(52) U.S. Cl. ...................................................... 257/326

(58) Field of Classification Search .......... 257/213–413, 257/900, 902–903, E21.19–E21.21, E21.394–E21.458, 257/E21.615–E21.694, 549–550, E29.266–E29.269, 257/E29.278–E29.279, E21.431–E21.437, 257/E21.619–E21.62, 151–153, E27.103, 257/68–71, 905–908, E27.084–E27.097, 257/E27.075, E21.646–E21.66, 165, 181, 257/127; 438/135, 142, 163, 201, 288, 573, 438/652, 255–266

See application file for complete search history.

(56) References Cited

U.S. PATENT DOCUMENTS

| | | | |
|---|---|---|---|
| 7,053,465 B2 * | 5/2006 | Benaissa et al. | 257/595 |
| 2002/0000618 A1 | 1/2002 | Saito et al. | |
| 2006/0049449 A1 * | 3/2006 | Iino et al. | 257/315 |
| 2007/0298568 A1 * | 12/2007 | Mokhlesi | 438/257 |
| 2008/0296682 A1 * | 12/2008 | Zhu et al. | 257/347 |

FOREIGN PATENT DOCUMENTS

JP   2001-319978   11/2001

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A semiconductor device includes a device isolation insulating film which is buried in a semiconductor substrate, a gate insulation film which is provided on the semiconductor substrate, a gate electrode which is provided on the gate insulation film, a source region and a drain region which are provided in the semiconductor substrate and spaced apart from each other in a manner to sandwich the gate electrode, both end portions of each of the source region and the drain region being offset from the device isolation insulating film in a channel width direction by a predetermined distance, and first and second gate electrode extension portions which are provided in a manner to cover both end portions of each of the source region and the drain region in a channel length direction.

6 Claims, 12 Drawing Sheets

Semiconductor device 10 (outline)

II-II' cross section

Vicinity of drain terminal 19 (channel region)

Manufacturing method (first embodiment)

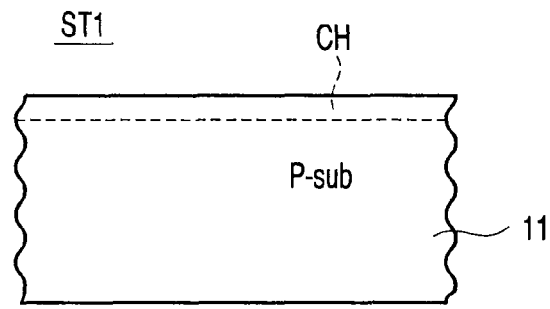
F I G. 1 2 A
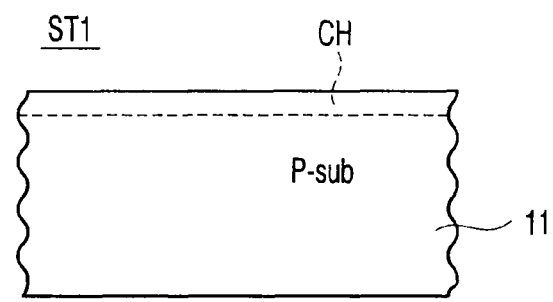
F I G. 1 2 B
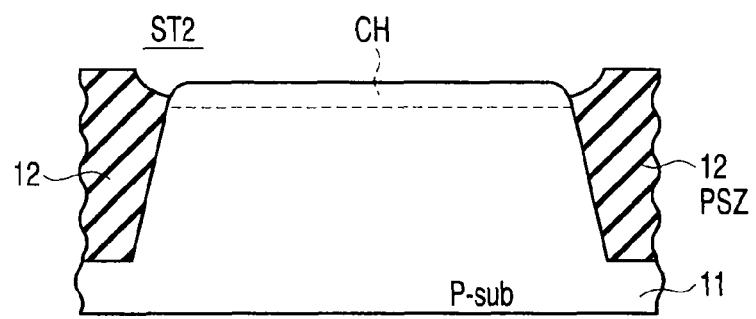
F I G. 1 3 A

Semiconductor device 100 (comparative example)

XIX-XIX' cross section (comparative example)

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2007-262619, filed Oct. 5, 2007, the entire contents of which are incorporated herein by reference.

BACKGROUND OF THE INVENTION

1. Field of the Invention

The present invention relates to a semiconductor device and a method of manufacturing the same, and is applied, for example, to a high-breakdown-voltage transistor which is disposed in a row decoder.

2. Description of the Related Art

In recent years, the integration density and capacity of nonvolatile memories, such as NAND flash EEPROMs, have been increased, and the chip size has been reduced. In order to reduce the chip size, it is necessary to reduce the unit cell size and the size of peripheral circuit parts. If attention is paid to the peripheral circuit, the gate length and device area of each transistor are reduced, thereby promoting chip shrink.

However, as is known, if the gate length and device region width of the transistor are decreased, the threshold value lowers and becomes non-uniform due to a reverse narrow channel effect, leading to deterioration in transistor characteristics (e.g. Jpn. Pat. Appln. KOKAI Publication No. 2001-319978). It is thus necessary to provide a structure of the transistor, which can suppress the occurrence of these problems and can prevent degradation of transistor characteristics.

The reverse narrow channel effect occurs at an interface between a channel region, which is a device region, and a device isolation insulating film, where a corner portion of the device region is present. At this corner portion, an active region is recessed and a gate electrode extends to the active region, and as a result, an electric field from the gate electrode concentrates. Consequently, turn-on occurs more easily in this part than the other part (central part) of the channel region, and the threshold lowers. In addition, with the development of microfabrication, as the channel width becomes narrower, the characteristics of the corner portion where turn-on occurs become more dominant. Thus, with the decrease in channel width, the threshold of turn-on of the transistor lowers.

Besides, it is considered that the reverse narrow channel effect is greatly influenced by removal of impurities (e.g. boron (B)) from the channel region.

In addition, in the case where a device isolation insulating film is formed of, e.g. polysilazane (PSZ: Partial Stabilized Zircon), there is a tendency that charge in the device isolation insulating film accumulates in the substrate at the above-described corner portion, and degrades the transistor characteristics.

It is necessary, therefore, to perform profile tuning of a diffusion layer, which is designed specifically for a peripheral transistor, and to improve the transistor characteristics, thereby to prevent degradation in transistor characteristics.

However, since the peripheral transistor is formed at the same time as the memory cell, it is difficult to consistently and integrally perform the processes for the memory cell and peripheral transistor. Consequently, the number of additional processes, such as ion implantation that is performed specifically for the peripheral transistor, increases, and the manufacturing cost rises.

BRIEF SUMMARY OF THE INVENTION

According to an aspect of the present invention, there is provided a semiconductor device comprising: a device isolation insulating film which is buried in a semiconductor substrate; a gate insulation film which is provided on the semiconductor substrate; a gate electrode which is provided on the gate insulation film; a source region and a drain region which are provided in the semiconductor substrate and spaced apart from each other in a manner to sandwich the gate electrode, both end portions of each of the source region and the drain region being offset from the device isolation insulating film in a channel width direction by a predetermined distance; and first and second gate electrode extension portions which are provided in a manner to cover both end portions of each of the source region and the drain region in a channel length direction.

According to another aspect of the present invention, there is provided a semiconductor device comprising: a device isolation insulating film which is buried in a semiconductor substrate; a gate insulation film which is provided on the semiconductor substrate; a gate electrode which is provided on the gate insulation film; a source region and a drain region which are provided in the semiconductor substrate and spaced apart from each other in a manner to sandwich the gate electrode, both end portions of each of the source region and the drain region being offset from the device isolation insulating film in a channel width direction by a predetermined distance; and first and second gate electrode extension portions which are provided in a manner to cover both end portions of each of the source region and the drain region in a channel length direction, wherein a central surface portion of a device region is exposed along the channel width direction.

According to still another aspect of the present invention, there is provided a method of manufacturing a semiconductor device, comprising: burying partial stabilized zircon in a device isolation region in a semiconductor substrate, thereby forming a device isolation insulating film; forming an insulation film on a device region on the semiconductor substrate; forming an electrically conductive film on the insulation film; coating a photoresist on the insulation film and the electrically conductive film; patterning the photoresist in an H shape covering both end portions of an active region in a channel length direction; performing anisotropic etching by using the patterned photoresist as a mask, thereby forming a gate electrode, first and second electrode extension portions and a gate insulation film; and doping impurities in the semiconductor substrate by using the gate electrode, the first and second electrode extension portions and the gate insulation film as a mask, thereby forming a source region and a drain region which are offset from end portions of the device isolation insulating film in a channel width direction by a predetermined distance.

BRIEF DESCRIPTION OF THE SEVERAL VIEWS OF THE DRAWING

FIG. 12A is a cross-sectional view illustrating a manufacturing method of the semiconductor device according to the first embodiment;

FIG. 12B is a cross-sectional view illustrating a manufacturing method of the semiconductor device according to the first embodiment;

FIG. 13A is a cross-sectional view illustrating a manufacturing method of the semiconductor device according to the first embodiment;

DETAILED DESCRIPTION OF THE INVENTION

Outline

Figure 1:
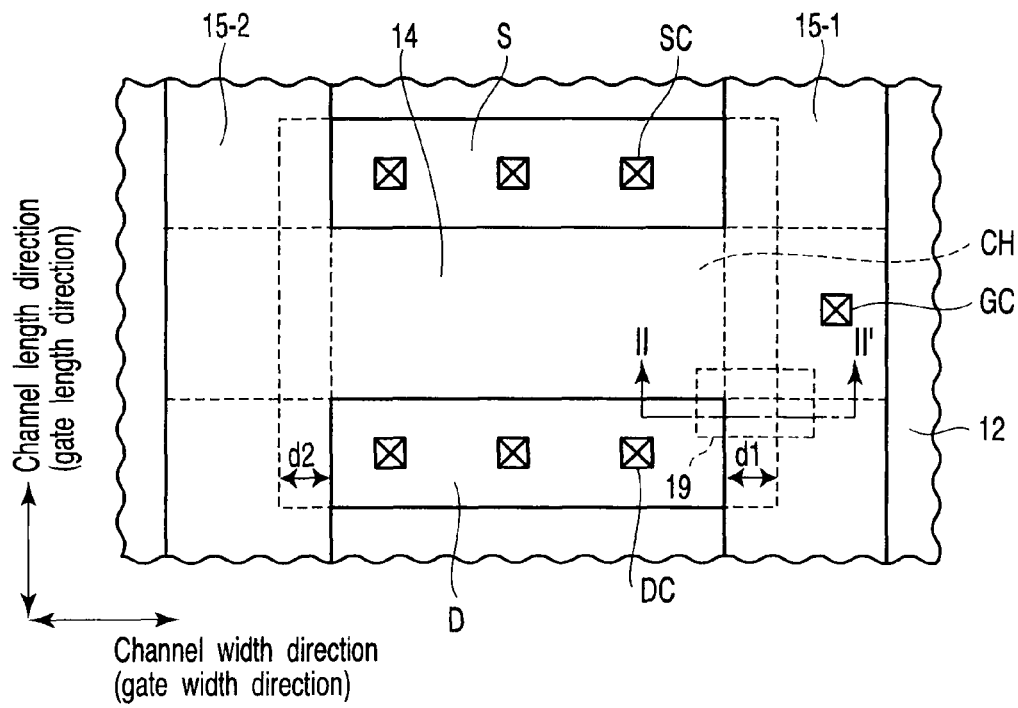
FIG. 1 is a plan view for describing the outline of the present invention.
Figure 2:
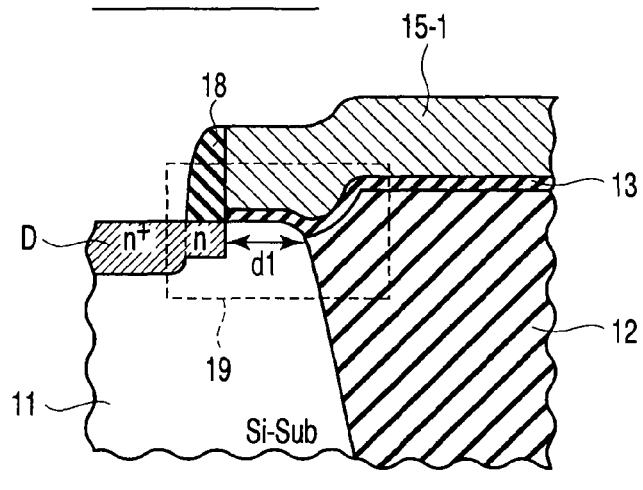
FIG. 2 is a cross-sectional view taken along line II-II' in FIG. 1.

To begin with, the outline of the present invention is described with reference to FIG. 1 and FIG. 2. FIG. 1 is a plan view for describing the outline of the present invention. FIG. 2 is a cross-sectional view taken along line II-II' in FIG. 1. In the plan view of FIG. 1, depiction of side walls (spacers) 18, which are provided along side walls of a gate electrode, is omitted.

In this example of the present invention, there is proposed a semiconductor device which can suppress a reverse narrow channel effect, and can prevent degradation of transistor characteristics.

As is shown in FIG. 1 and FIG. 2, the semiconductor device is configured to include a device isolation insulating film 12 which is buried in a semiconductor substrate 11; a gate insulation film 13 provided on the semiconductor substrate; a gate electrode 14 provided on the gate insulation film; a source region S and a drain region D which are provided to be spaced apart in the semiconductor substrate in a manner to sandwich the gate electrode; and first and second gate electrode extension portions 15-1 and 15-2 which are provided in a manner to cover both end portions of each of the source and drain regions in a channel length direction. Both end portions of each of the source and drain regions are offset from the device isolation insulation film 12 in a channel width direction by predetermined distances d1 and d2, respectively.

Both end portions of each of the source region S and drain region D, which are covered with the first and second gate electrode extension portions 15-1 and 15-2 in the channel length direction, are, to be more specific, both end portions of each of the source region S and drain region D, which extend in the channel width direction.

According to the above-described structure, the semiconductor device 10 includes first and second gate electrode extension portions 15-1 and 15-2, which are provided so as to cover both end portions of each of the source region and drain region in the channel length direction. In addition, both end portions of each of the source region and drain region in the channel width direction are offset from the device isolation insulating film 12 in the channel width direction by predetermined distances d1 and d2, respectively.

Thus, as indicated by a broken line 19, at an interface between the drain region D, which is a device region, and the device isolation insulating film 12, where a corner portion of the device region (active region: AA) is present, the gate electrode 14 does not extend to the active region and it is possible to prevent concentration of an electric field from the gate electrode 14. Therefore, the electric field intensity can be made uniform between the corner portion of the channel region and the other portion (central portion) of the channel region. As a result, the reverse narrow channel effect can be suppressed, and degradation of transistor characteristics can be prevented.

Further, by virtue of the offset structure, removal of impurities (e.g. boron (B)) in the effective channel portion can be avoided, and a uniform channel profile can be formed.

In addition, since both end portions of each of the source region and drain region are offset from the device isolation insulating film 12 in the channel width direction by the predetermined distances d1 and d2, even in the case where the device isolation insulating film 12 is formed of polysilazane (PSZ: Partial Stabilized Zircon), it is possible to prevent charge in the device isolation insulating film 12 from accumulating in the substrate 11, and to prevent degradation of the transistor characteristics.

A description will now be given of some embodiments of the invention, which are considered to be the best modes, and a comparative example. In the description below, common parts are denoted by like reference numerals throughout the drawings. In addition, in the following description, a NAND flash memory is taken as an example.

First Embodiment

An Example in which the Invention is Applied to a NAND Flash Memory

Next, referring to FIG. 3 to FIG. 15, a semiconductor device according to a first embodiment of the invention and a manufacturing method thereof are described. In the description below, the case in which the invention is applied to a word line control circuit of a NAND flash memory is described by way of example.

1. Example of Entire Structure

Figure 3:
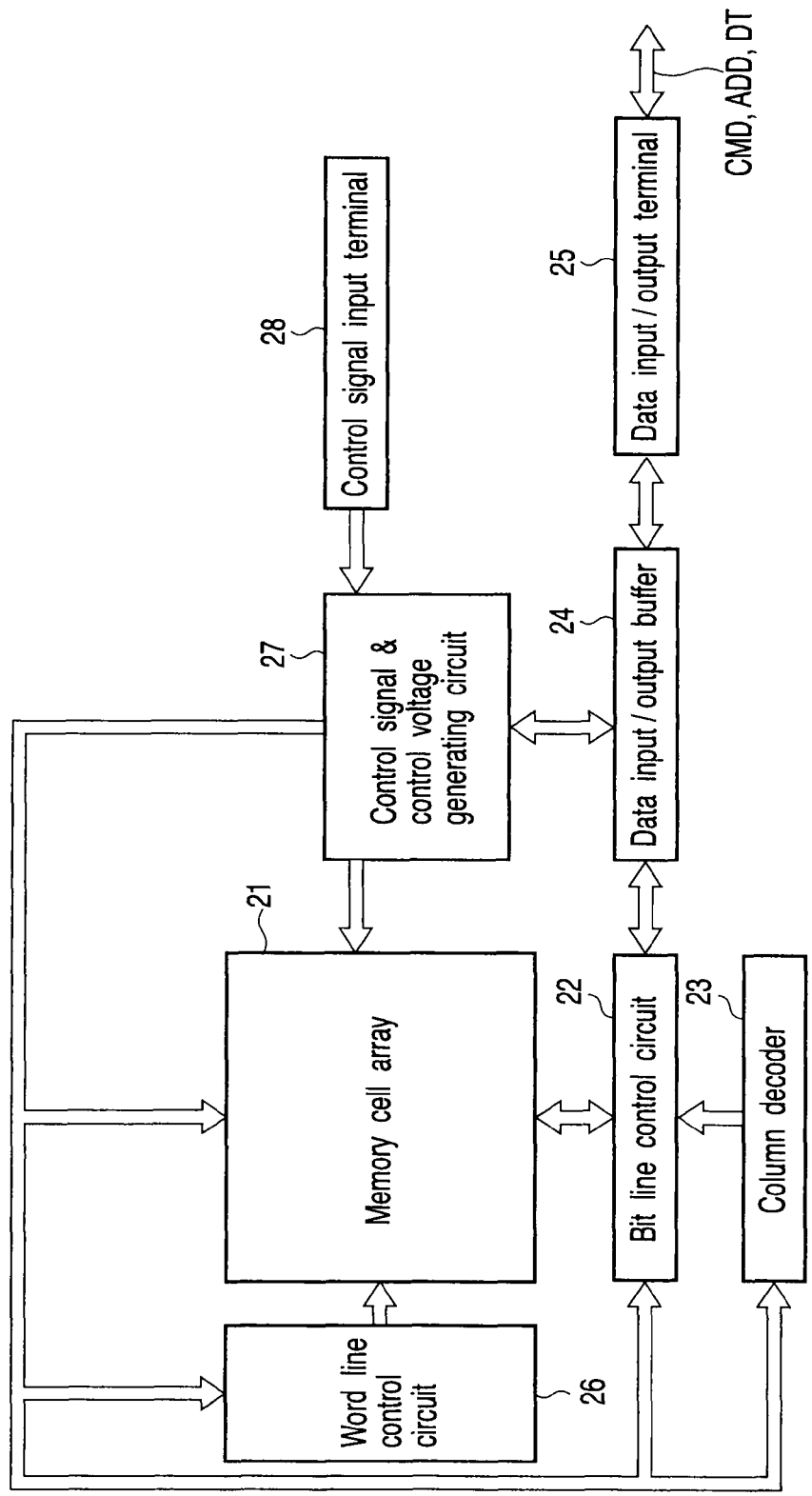
FIG. 3 is a block diagram showing an example of the whole structure of a semiconductor device according to a first embodiment of the invention.

To begin with, referring to FIG. 3, a description is given of an example of the entire structure of the NAND flash memory. FIG. 3 is a block diagram showing the NAND flash memory according to this embodiment.

As shown in FIG. 3, the NAND flash memory comprises a memory cell array 21, a bit line control circuit 22, a column decoder 23, a data input/output buffer 24, a data input/output terminal 25, a word line control circuit 26, a control signal & control voltage generating circuit 27, and a control signal input terminal 28.

The memory cell array 21 is composed of a plurality of blocks. The word line control circuit 26 for controlling word lines, the bit line control circuit 22 for controlling bit lines and the control signal & control voltage generating circuit 27 are connected to the memory cell array 21.

The bit line control circuit 22 reads data of memory cells in the memory cell array 21 via the bit lines, and detects the states of the memory cells in the memory cell array 21 via the bit lines. In addition, the bit line control circuit 22 executes data write in the memory cells by applying write control voltages to the memory cells in the memory cell array 21 via the bit lines. The column decoder 23, the data input/output buffer 24 and the control signal & control voltage generating circuit 27 are connected to the bit line control circuit 22.

Data memory circuits (not shown) are provided in the bit line control circuit 22, and the data memory circuits are selected by the column decoder 23. The data of the memory cells, which are read into the data memory circuits, are output to the outside from the data input/output terminal 25 via the data input/output buffer 24. The data input/output terminal 25 is connected to, for example, a host device which is disposed outside the NAND flash memory.

The host device is, for instance, a microcomputer, which receives data that is output from the data input/output terminal 25. Further, the host device outputs various commands CMD which control the operation of the NAND flash memory, addresses ADD and data DT. Write data, which is input to the data input/output terminal 25 from the host device, is delivered via the data input/output buffer 24 to the data memory circuits (not shown) which are selected by the column decoder 23. On the other hand, the commands and addresses are delivered to the control signal & control voltage generating circuit 27.

The word line control circuit 26 selects the word lines in the memory cell array 21, and applies voltages necessary for data read, write or erase to the selected word lines.

The control signal & control voltage generating circuit 27 is connected to the memory cell array 21, bit line control circuit 22, column decoder 23, data input/output buffer 24 and word line control circuit 26. These connected structural circuits are controlled by the control signal & control voltage generating circuit 27. The control signal & control voltage generating circuit 27 is connected to the control signal input terminal 28, and is controlled by control signals, such as an ALE (address latch enable) signal, which are input from the host device via the control signal input terminal 28.

The word line control circuit 26, bit line control circuit 22, column decoder 23 and control signal & control voltage generating circuit 27 constitute a write circuit and a read circuit.

2. Structure Example of the Block

Figure 4:
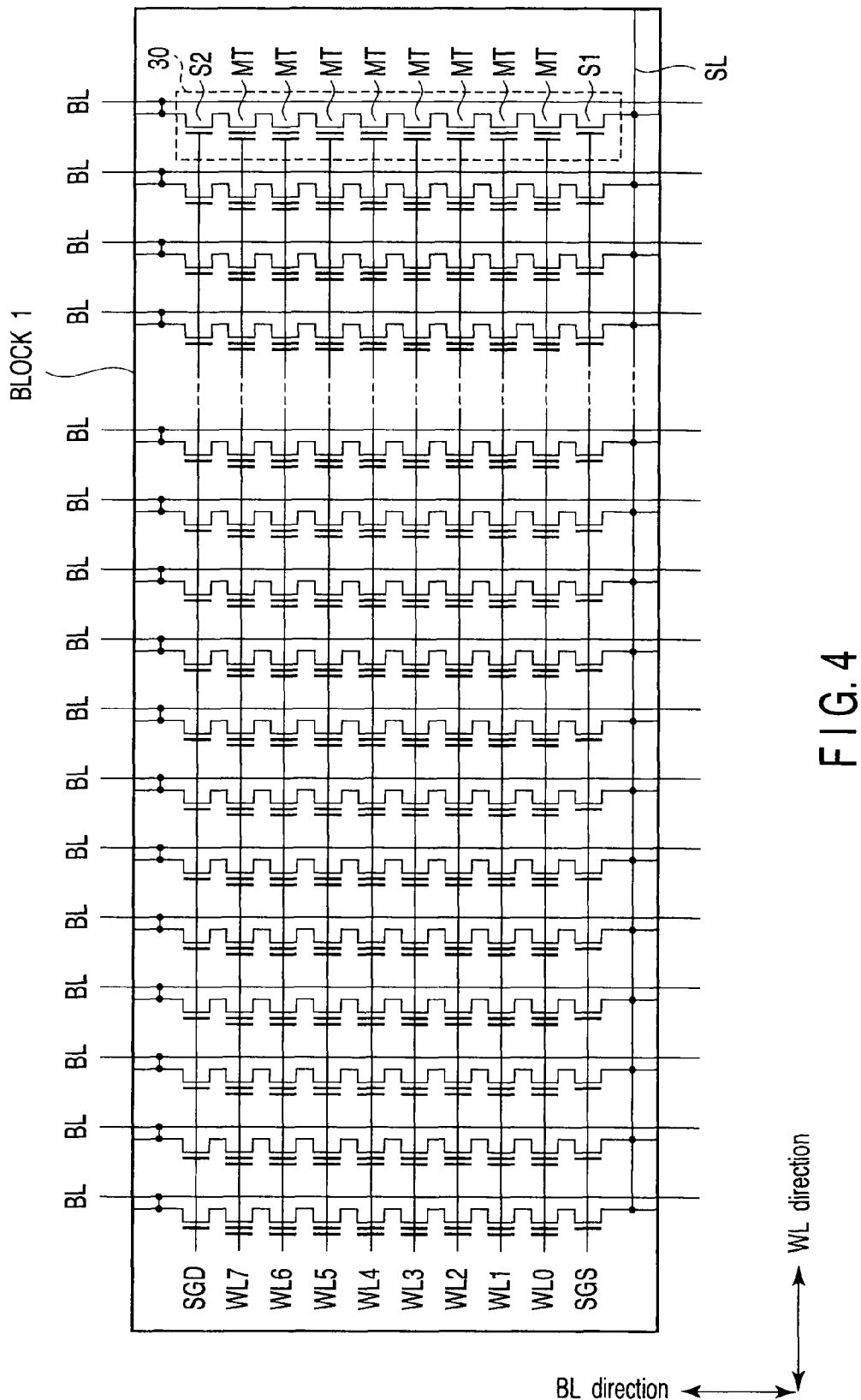
FIG. 4 is a circuit diagram showing one block (BLOCK) according to the first embodiment.

Next, a structure example of the blocks, which constitute the memory cell array 21, is described with reference to FIG. 4. In this description, one block BLOCK1 is exemplified. In the case of this example, the memory cells in the block BLOCK1 are erased batchwise. In other words, the block is an erase unit.

The block BLOCK1 is composed of a plurality of memory cell strings 30 which are arranged in the word line direction (WL direction). The memory cell string 30 comprises a NAND string which is composed of eight memory cells MT having series-connected current paths, a select transistor S1 which is connected to one end of the NAND string, and a select transistor S2 which is connected to the other end of the NAND string.

In the present example, the NAND string is composed of eight memory cells MT. However, it should suffice if the NAND string is composed of two or more memory cells, and the number of memory cells is not limited to eight. The select transistor S1 is connected to a source line SL, and the select transistor S2 is connected to the bit line BL.

Word lines WL extend in the WL direction and are commonly connected to a plurality of memory cells MT which are arranged in the WL direction. A select gate line SGS extends in the WL direction and is commonly connected to a plurality of select transistors S1 which are arranged in the WL direction. A select gate line SGD also extends in the WL direction and is commonly connected to a plurality of select transistors S2 which are arranged in the WL direction.

3. Structure Example of Word Line Control Circuit

Next, a structure example of the word line control circuit is described with reference to FIG. 5.

Figure 5:
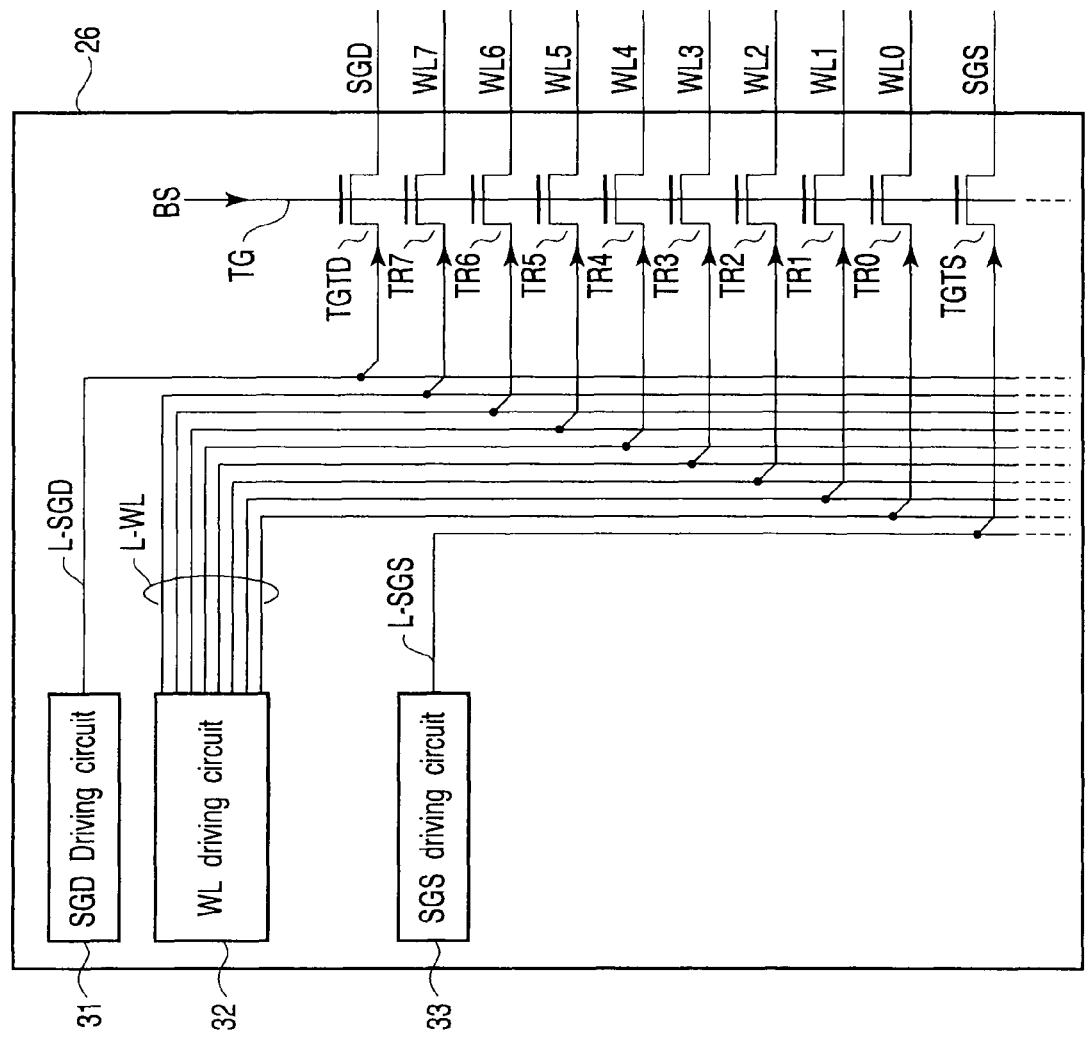
FIG. 5 is a circuit diagram showing a word line control circuit according to the first embodiment.

FIG. 5 shows a structure example of the word line control circuit 26 according to this embodiment.

As shown in FIG. 5, the word line control circuit 26 according to this embodiment includes transfer transistors TGTD, TGTS and TR0 to TR7, an SGD driving circuit 31, a WL driving circuit 32 and an SGS driving circuit 33.

The transfer transistors TGTD, TGTS and TR0 to TR7 are high-breakdown-voltage transistors having gates commonly connected to a transfer gate line TG. A block select signal BS, which selects one of the blocks, is input to the transfer gate line TG.

One end of the current path of the transfer transistor TGTD is connected to the select gate SGD, and the other end of the current path thereof is connected to the SGD driving circuit 31 via a wiring line L-SGD. The transfer transistor TGTD, the wiring line L-SGD and the SGD driving circuit 31 constitute a select gate voltage generating circuit.

One end of the current path of the transfer transistor, TR0 to TR7, is connected to the word line, WLC to WL7, and the other end of the current path thereof is connected to the WL driving circuit 32 via a wiring line L-WL. The transfer transistors TR0 to TR7, the wiring line L-WL and the WL driving circuit 32 constitute a word line voltage generating circuit.

One end of the current path of the transfer transistor TGTS is connected to the select gate SGS, and the other end of the current path thereof is connected to the SGS driving circuit 33 via a wiring line L-SGS. The transfer transistor TGTS, the wiring line L-SGS and the SGS driving circuit 33 constitute a select gate voltage generating circuit.

4. Transfer Transistor

4-1. Structure Example of Transfer Transistor

Figure 6:
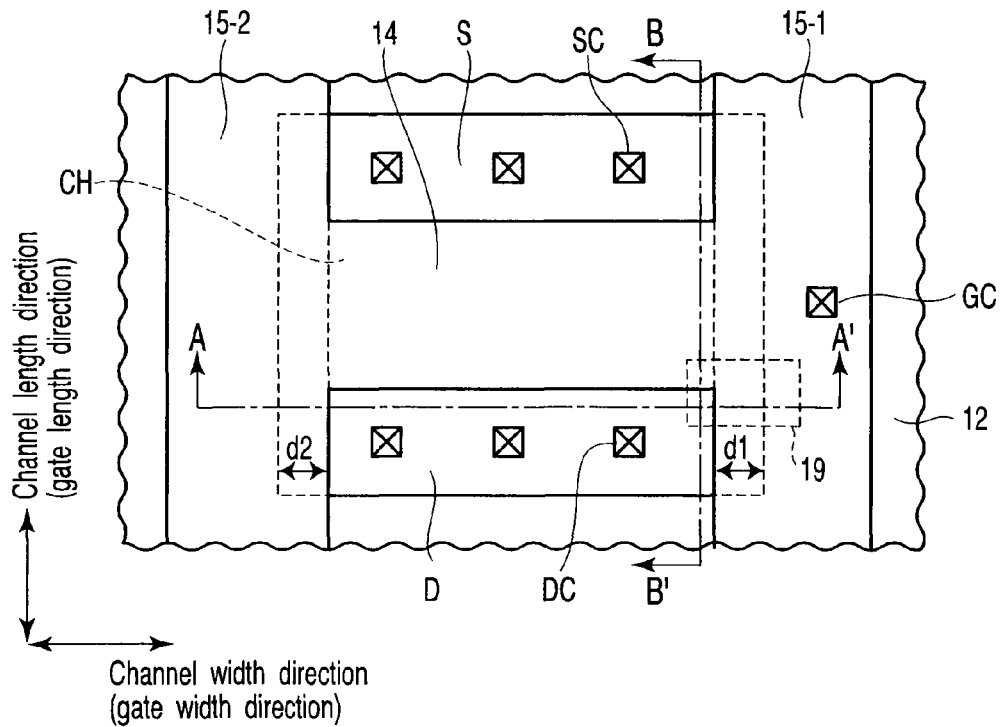
FIG. 6 is a plan view showing a transfer transistor according to the first embodiment.
Figure 7:
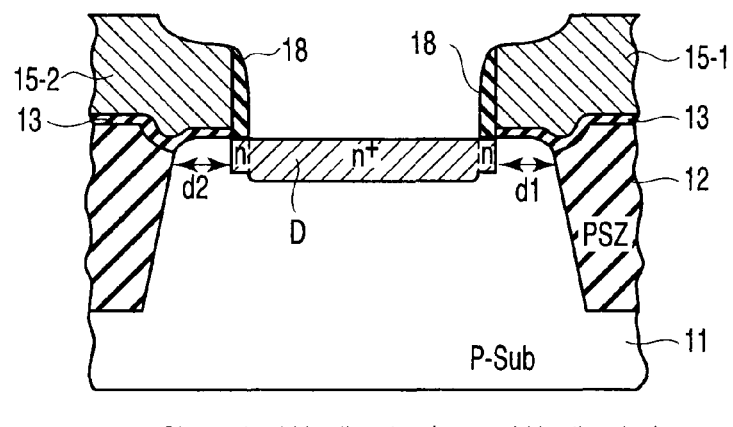
FIG. 7 is a cross-sectional view taken along line A-A' in FIG. 6.
Figure 8:
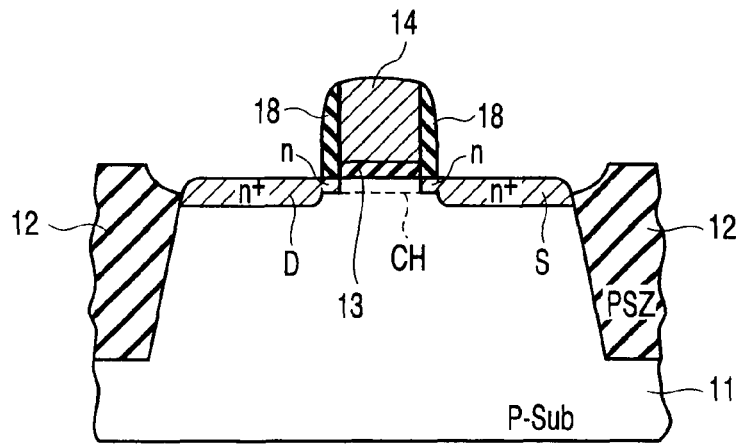
FIG. 8 is a cross-sectional view taken along line B-B' in FIG. 6.
Figure 9:
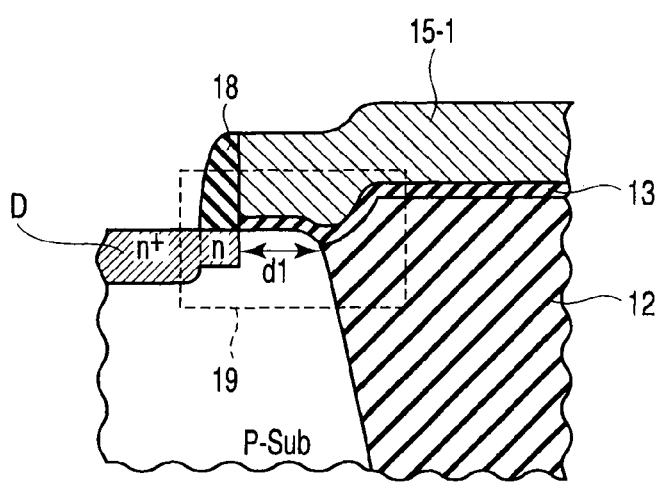
FIG. 9 is a cross-sectional view showing the vicinity of a broken line 19 in FIG. 6.

Next, referring to FIG. 6 to FIG. 10, a description is given of a structure example of the transfer transistor which constitutes the word line driving circuit. In this description, the transfer transistor TR0 in FIG. 5 is taken as an example. In the plan view of FIG. 6, depiction of side walls (spacers) 18, which are provided along side walls of the gate electrode 14, is omitted.

As is shown in FIG. 6 to FIG. 9, the transfer transistor TR0 is configured to include a device isolation insulating film 12 which is buried in a semiconductor substrate 11; a gate insulation film 13 provided on the semiconductor substrate; a gate electrode 14 provided on the gate insulation film; a source region S and a drain region D which are provided to be spaced apart in the semiconductor substrate in a manner to sandwich the gate electrode; and first and second gate electrode extension portions 15-1 and 15-2 which are provided in a manner to cover both end portions of each of the source and drain regions in a channel length direction. Both end portions of each of the source and drain regions are offset from the device isolation insulation film 12 in a channel width direction by predetermined distances d1 and d2, respectively.

Both end portions of each of the source region S and drain region D, which are covered with the first and second gate electrode extension portions 15-1 and 15-2 in the channel length direction, are, to be more specific, both end portions of each of the source region S and drain region D, which extend in the channel width direction.

Source contact wiring SC is provided on the source region S. Drain contact wiring DC is provided on the drain region D. Gate electrode contact wiring GC is provided on the first gate electrode extension portion 15-1.

4-2. Operation of Transfer Transistor

Figure 10:
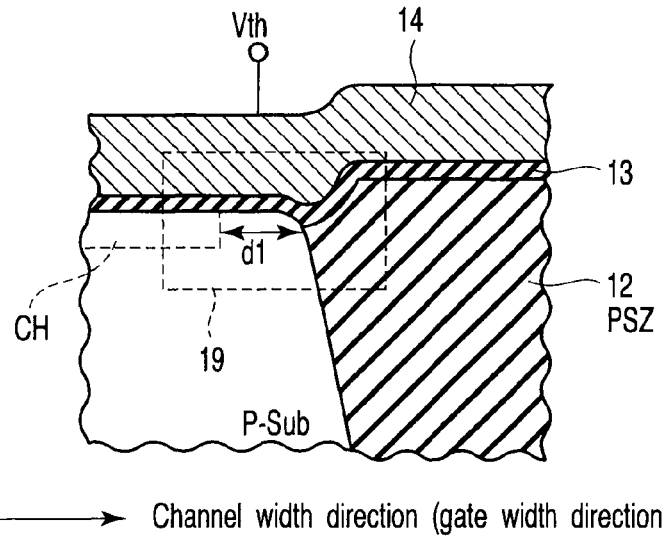
FIG. 10 is a cross-sectional view showing the vicinity of a broken line 19 in FIG. 6, FIG. 10 being a view for explaining the operation of the transfer transistor according to the first embodiment.
Figure 11:
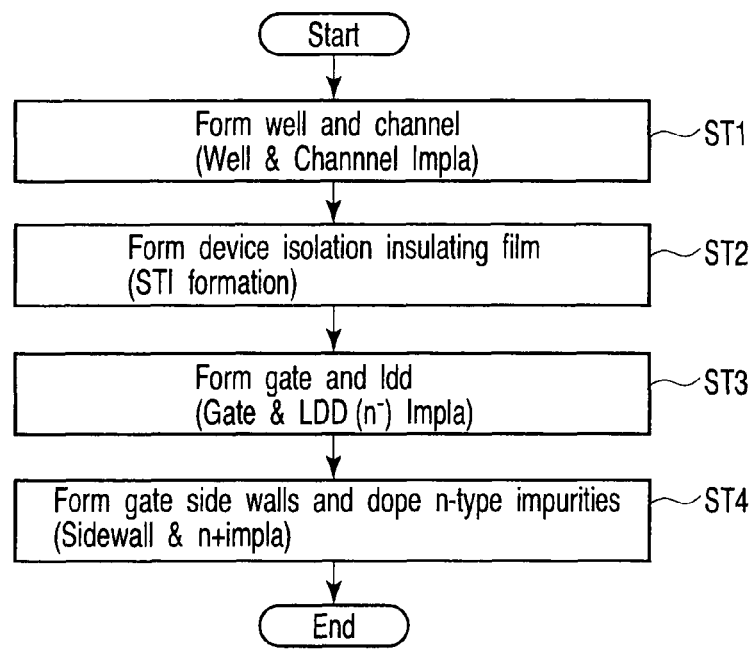
FIG. 11 is a flow chart illustrating a method of manufacturing the semiconductor device according to the first embodiment.

Next, the transfer operation of the transfer transistor is described with reference to FIG. 10.

To begin with, the transfer gate line TG is selected. Thereby, a threshold voltage Vth is applied to the gate electrode 14, and thus a channel CH between the source S and drain D is rendered conductive and the transistor TR0 is turned on. In the case of the present embodiment, the threshold voltage Vth is, e.g. approximately VpgmH, which is higher than a write voltage Vpgm of the memory transistor MT.

Then, in accordance with selection/non-selection of the word line WL0, for example, a write voltage Vpgm or an intermediate voltage Vpass is transferred to the word line WL0.

As has been described above, the transfer transistor TR0 includes the first and second gate electrode extension portions 15-1 and 15-2 which are formed by extending the gate electrode 14 so as to cover peripheral parts of the active regions in the channel width direction. Thus, both end portions of each of the source region S and drain region D are offset from the device isolation insulating film 12 in the channel width direction by predetermined distances d1 and d2. With this structure, the gate electrode 14 does not extend to the active region at the corner portion indicated by the broken line 19. Thus, even at the time of the transfer operation, it is possible to prevent concentration of an electric field due to a high voltage (e.g. approximately VpgmH) which is applied from the gate electrode 14. Therefore, the electric field intensity can be made uniform between the corner portion of the channel region CH and the other portion (central portion) of the channel region CH. As a result, the reverse narrow channel effect can be suppressed, and degradation of characteristics of the transfer transistor TR0 can be prevented.

Further, by virtue of the offset structure, removal of impurities (e.g. boron (B)) in the effective channel portion can be avoided, and a uniform channel profile can be formed.

In addition, both end portions of each of the source region S and drain region D are offset from the device isolation insulating film 12 in the channel width direction by the predetermined distances d1 and d2. Thus, even in the case where the device isolation insulating film 12 is formed of polysilazane (PSZ: Partial Stabilized Zircon), it is possible to prevent charge in the device isolation insulating film 12 from accumulating in the substrate 11 (Si-sub), and to prevent the reverse narrow channel effect. Therefore, degradation of the transistor characteristics can be prevented.

Furthermore, even in the state in which the transfer operation is finished and the gate is in the off state with no threshold voltage Vth being applied to the gate electrode 14, the cut-off characteristics at the corner portion can advantageously be improved.

5. Manufacturing Method

Next, a method of manufacturing the semiconductor device according to the present embodiment is described with reference to FIG. 11 to FIG. 15. In this description, the above-described transistor TR0 is taken as an example, and the method is described with reference to a flow chart of FIG. 11. FIG. 12A to FIG. 15A are cross-sectional views taken along line A-A' in FIG. 6, and show fabrication steps. FIG. 12B to FIG. 15B are cross-sectional views taken along line B-B' in FIG. 6, and show fabrication steps.

Step ST1 (Well & Channel Impla)

To start with, for example, using an ion implantation method, P-type impurities such as boron (B) or N-type impurities such as phosphorus (P) or arsenic (As) are doped in the semiconductor substrate (P-sub) 11, and a predetermined P well (P-well) and N well (N-well) are formed (not shown).

Then, as shown in FIG. 12A and FIG. 12B, P-type impurities such as boron (B) are doped in the semiconductor substrate (P-sub) 11 by using, e.g. an ion implantation method, and a channel region CH is formed.

Step ST2 (STI Formation)

Then, a predetermined trench is formed in the semiconductor substrate 11 in the device isolation region by using anisotropic etching such as RIE (Reactive Ion Etching).

Figure 13B:
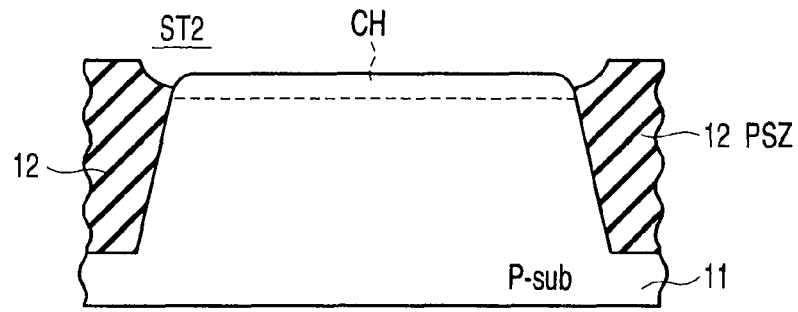
FIG. 13B is a cross-sectional view illustrating a manufacturing method of the semiconductor device according to the first embodiment.

Subsequently, as shown in FIGS. 13A and 13B, polysilazane (PSZ: Partial Stabilized Zircon) is buried in the trench by, e.g. CVD, and a device isolation insulating film 12 is formed.

Step ST3 (Gate & LDD (n$^-$) Impla)

On the semiconductor substrate 11 and device isolation insulating film 12, an oxide film is formed by using, e.g. thermal oxidation (not shown).

Then, a polysilicon layer is formed on the oxide film by, e.g. CVD (not shown).

On the polysilicon layer, a photoresist is coated (not shown).

Subsequently, for example, by using a photolithography method, exposure/development is performed on the photoresist, and the photoresist is patterned. In this case, the photoresist is patterned in an H shape in a manner to cover both end portions of the active region in the channel length direction.

Figure 14A:
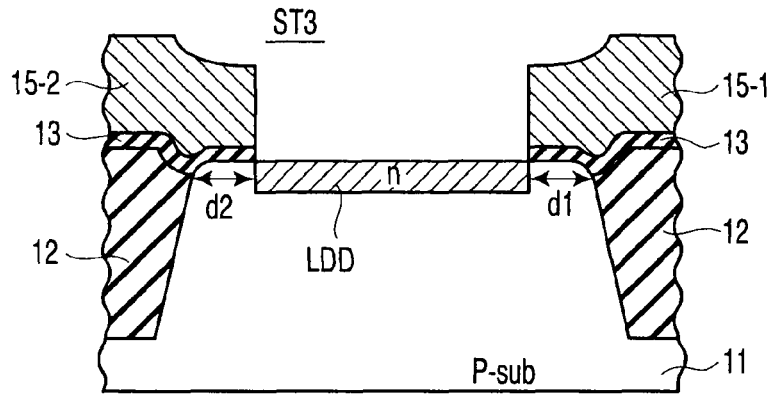
FIG. 14A is a cross-sectional view illustrating a manufacturing method of the semiconductor device according to the first embodiment.
Figure 14B:
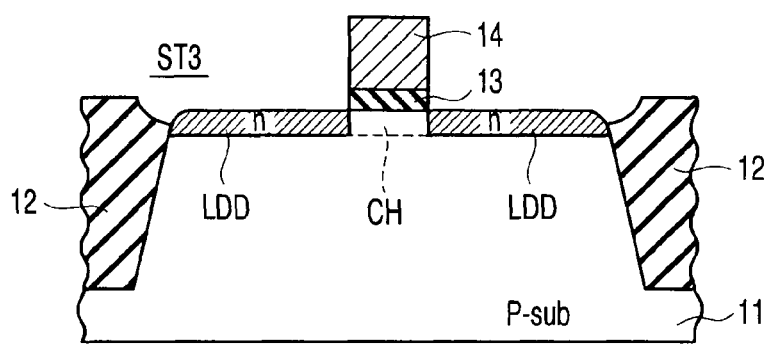
FIG. 14B is a cross-sectional view illustrating a manufacturing method of the semiconductor device according to the first embodiment.

As shown in FIG. 14A and FIG. 14B, using the patterned photoresist as a mask, anisotropic etching, such as RIE, is performed to a level of the surface of the semiconductor substrate 11, and the polysilicon layer and oxide film are etched. Then, a gate electrode 14, first and second gate electrode extension portions 15-1 and 15-2 and a gate insulation film 13 are successively formed on the semiconductor substrate (P-sub).

Following the above, using the device isolation insulating film 12, gate electrode 14 and first and second gate electrode extension portions 15-1 and 15-2 as a mask, N-type impurities, such as phosphorus (P) or arsenic (As), are doped in the semiconductor substrate 11 by using, e.g. an ion implantation method, and LDD regions (n-type impurity regions) are formed.

Step ST4 (Sidewall & n+Impla)

Then, a silicon oxide ($SiO_2$) film is formed by, e.g. CVD, on the surface of the gate electrode 14 and first and second gate electrode extension portions 15-1 and 15-2.

Figure 15A:
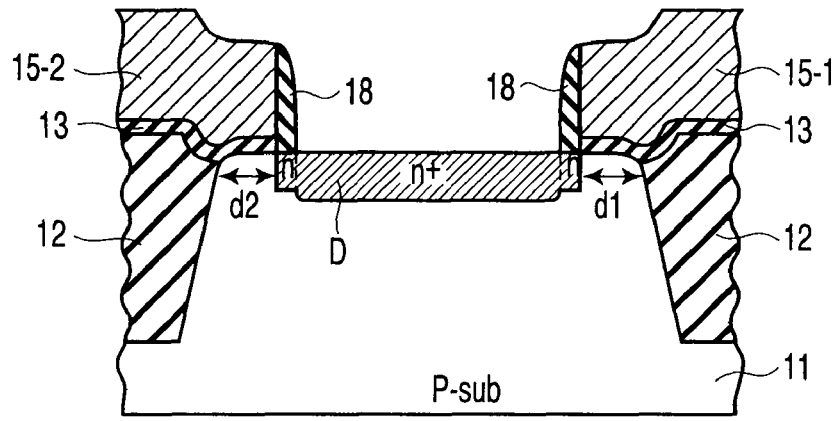
FIG. 15A is a cross-sectional view illustrating a manufacturing method of the semiconductor device according to the first embodiment.
Figure 15B:
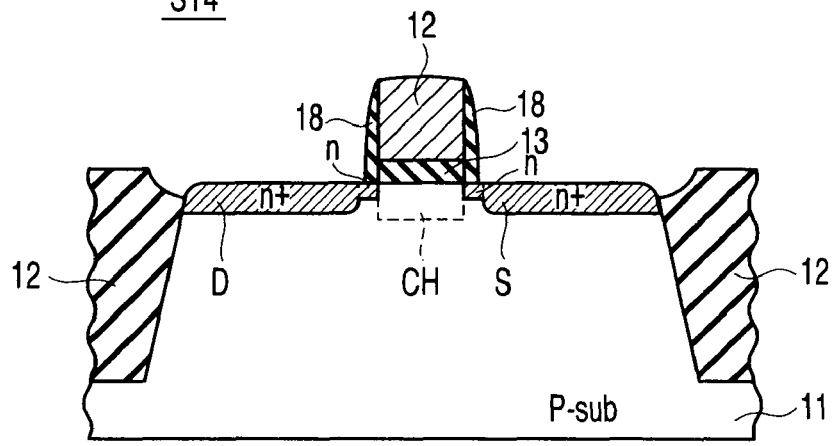
FIG. 15B is a cross-sectional view illustrating a manufacturing method of the semiconductor device according to the first embodiment.

Subsequently, as shown in FIG. 15A and FIG. 15B, anisotropic etching, such as RIE, is performed on the silicon oxide film, and side walls (spacers) 18 are formed in a self-alignment manner along side walls of the gate electrode 14 and first and second gate electrode extension portions 15-1 and 15-2.

Using the device isolation insulating film 12, the gate electrode 14 and the first and second gate electrode extension portions 15-1 and 15-2 as a mask, N-type impurities such as phosphorus (P) or arsenic (As) are doped in the semiconductor substrate 11 by using, e.g. an ion implantation method, and a source region S and a drain region D are formed.

6. Advantageous Effects of the Present Embodiment

At least the following advantageous effects (1) to (3) can be obtained by the semiconductor device according to the present embodiment and the method of manufacturing the same.

(1) Reverse narrow channel effect can be suppressed, and degradation in transistor characteristics can be prevented.

As has been described above, the transfer transistor TR0 according to this embodiment includes the device isolation insulating film 12 which is buried in the semiconductor substrate 11; the gate insulation film provided on the semiconductor substrate; the gate electrode 14 provided on the gate insulation film; the source region S and drain region D which are provided to be spaced apart in the semiconductor substrate in a manner to sandwich the gate electrode; and the first and second gate electrode extension portions 15-1 and 15-2 which are provided in a manner to cover both end portions of each of the source and drain regions in the channel length direction. Both end portions of each of the source and drain regions are offset from the device isolation insulation film 12 in the channel width direction by predetermined distances d1 and d2, respectively.

As has been described above, the transfer transistor TR0 includes the first and second gate electrode extension portions 15-1 and 15-2 which are formed by extending the gate electrode 14 so as to cover peripheral parts of the active regions in the channel width direction. Thus, both end portions of each of the source region S and drain region D are offset from the device isolation insulating film 12 in the channel width direction by predetermined distances d1 and d2. Thus, even at the time of the transfer operation, it is possible to prevent an electric field due to a high voltage (e.g. approximately VpgmH), which is applied from the gate electrode 14, from concentrating at the corner portion which is surrounded and indicated by the broken line 19. Therefore, the electric field intensity can be made uniform between the corner portion of the channel region CH and the other portion (central portion) of the channel region CH. Thereby, the influence of the corner portion can be avoided, and a decrease in threshold of the transistor TR0 and non-uniformity in threshold can be suppressed.

Further, by virtue of the offset structure, removal of impurities (e.g. boron (B)) in the effective channel portion can be avoided, and a uniform channel profile can be formed.

As described above, the reverse narrow channel effect can be suppressed, and degradation of characteristics of the transfer transistor TR0 can be prevented.

(2) Even in the case where the device isolation insulating film 12 is formed of polysilazane (PSZ), the degradation of transistor characteristics can be prevented.

Both end portions of each of the source region S and drain region D are offset from the device isolation insulating film 12 in the channel width direction by the predetermined distances d1 and d2. Thus, even in the case where the device isolation insulating film 12 is formed of polysilazane (PSZ: Partial Stabilized Zircon), it is possible to prevent charge in the device isolation insulating film 12 from accumulating in the substrate 11, and to prevent degradation of the transistor characteristics.

Furthermore, even in the state in which the transfer operation is finished and the gate is in the off state with no threshold voltage Vth being applied to the gate electrode 14, the cut-off characteristics at the corner portion can advantageously be improved.

(3) The manufacturing cost can advantageously be reduced.

According to the manufacturing method of the semiconductor device of the present embodiment, the manufacturing cost can be reduced since the number of fabrication processes does not increase and only the design alteration of the photoresist is necessary.

For example, as shown in FIG. 14A and FIG. 14B, by using a photolithography method, exposure/development is performed on the photoresist, and the photoresist is patterned. In this case, the photoresist is patterned in the H shape so as to cover both end portions of the active region in the channel length direction. Subsequently, using the patterned photoresist as a mask, anisotropic etching, such as RIE, is performed to the level of the surface of the semiconductor substrate 11, and the polysilicon layer and oxide film are etched. Then, the gate electrode 14, first and second gate electrode extension portions 15-1 and 15-2 and gate insulation film 13 are successively formed on the semiconductor substrate (P-sub).

In this manner, the gate electrode 14 and first and second gate electrode extension portions 15-1 and 15-2 can be formed at the same time, only by making design alteration to pattern the photoresist in the H shape. Therefore, the number of fabrication steps does not increase, and in this respect the manufacturing cost can advantageously be reduced.

Conventional peripheral transistors, for example, both types of transistors for power supply voltage (low voltage) use and for high voltage use that is peculiar to the NAND flash memory, are commonly formed in the same shape, and the manufacturing method comprises substantially the same fabrication steps, except for a selective fabrication step by ion implantation. In order to impart transistor characteristics, additional ion implantation is performed for each individual transistor by the selective fabrication using lithography, thereby taking a measure for suppressing the reverse narrow channel effect. Further, if consideration is given to the reverse narrow channel effect, a decrease in dosage of the channel portion due to oxidation of the corner portion of the device region, for example, leads to adverse effects such as a decrease in threshold value and an increase in off-leak.

Besides, positive charge is accumulated in the device isolation region, and a channel forms at an end part of the corner portion even when the gate is in the off state, leading to an increase in off-leak. These become more conspicuous if the width of the device region is decreased.

As described above, in the conventional manufacturing method, the number of fabrication steps increases, which is disadvantageous in reducing the manufacturing cost.

In the present embodiment, the N-type transistor TR0 has been described by way of example. However, the invention is not limited to this example. Specifically, the present embodiment is applicable to both the structures of the N-channel transistor and P-channel transistor. Furthermore, transistors of both the low-voltage type and high-voltage type, which are applied to the NAND flash memory, can be manufactured with the same structure.

Second Embodiment

Series-Gate Type Transistor

Next, a semiconductor memory device according to a second embodiment of the invention is described with reference to FIG. 16 and FIG. 17. This embodiment relates to an example of a series-gate type transistor. A detailed description of parts common to those in the first embodiment is omitted here.

In the first embodiment, a single-unit transistor has been described by way of example. However, the invention is not limited to this example, and is similarly applicable to a series-gate type transistor, as shown in FIG. 16.

Figure 16:
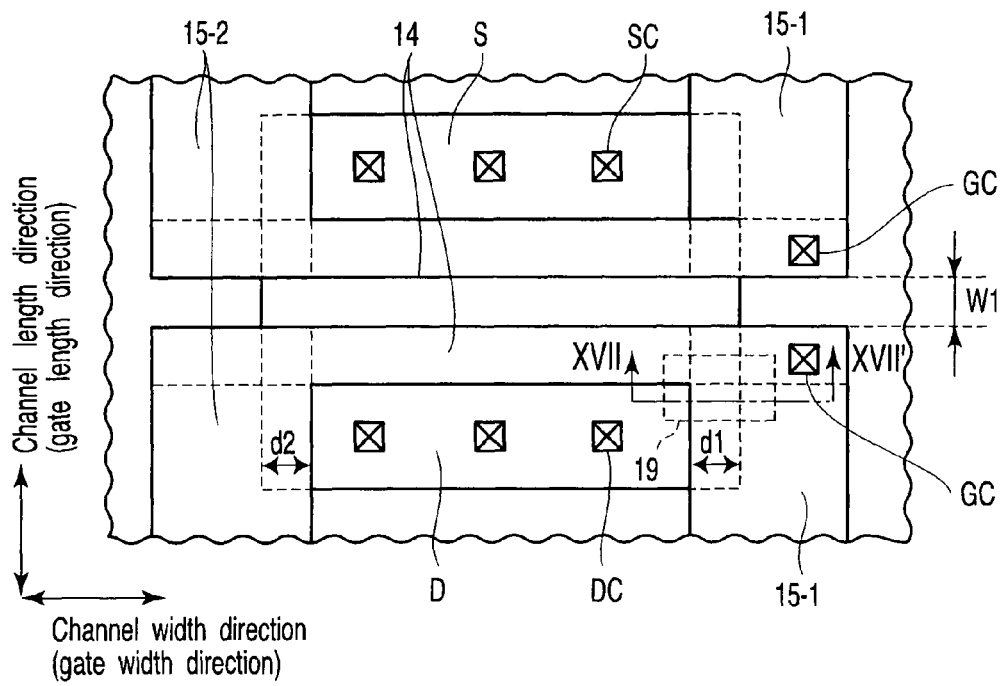
FIG. 16 is a plan view showing a semiconductor device according to a second embodiment of the present invention.

As shown in FIG. 16, the transfer transistor TR0 according to this embodiment differs from that of the first embodiment in that a central surface portion of the device region is exposed along the channel width direction.

Figure 17:
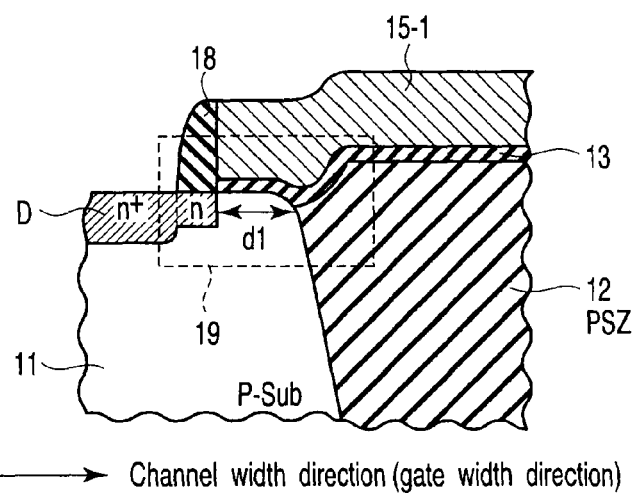
FIG. 17 is a cross-sectional view taken along line XVII-XVII' in FIG. 16.

As shown in FIG. 17, the neighborhood of the corner portion 19 is the same as in the first embodiment.

The manufacturing method differs from that in the first embodiment in the following respect. For example, after the photoresist is patterned in the H shape covering both end portions of the active region in the channel length direction in the above-described step ST3, the photoresist is patterned such that a central surface portion of the device region is exposed along the channel width direction.

In the other respects, the manufacturing method is substantially the same as that in the first embodiment, so a detailed description is omitted.

As described above, according to the semiconductor device of the present embodiment, the same advantageous effects (1) to (3) as described above can be obtained. Further, as in this embodiment, the invention is applicable, where necessary, to a series-gate type transistor.

Comparative Example

Next, for comparison with the semiconductor devices relating to the above-described embodiments, a semiconductor device according to a comparative example is described with reference to FIG. 18 and FIG. 19.

Figure 18:
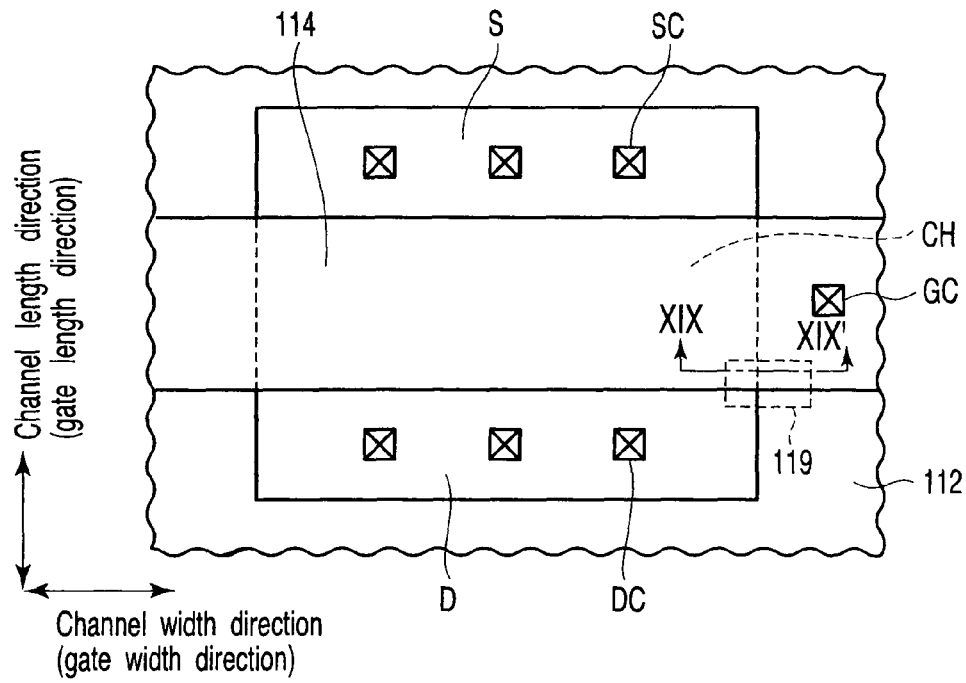
FIG. 18 is a plan view showing a semiconductor device according to a comparative example.
Figure 19:
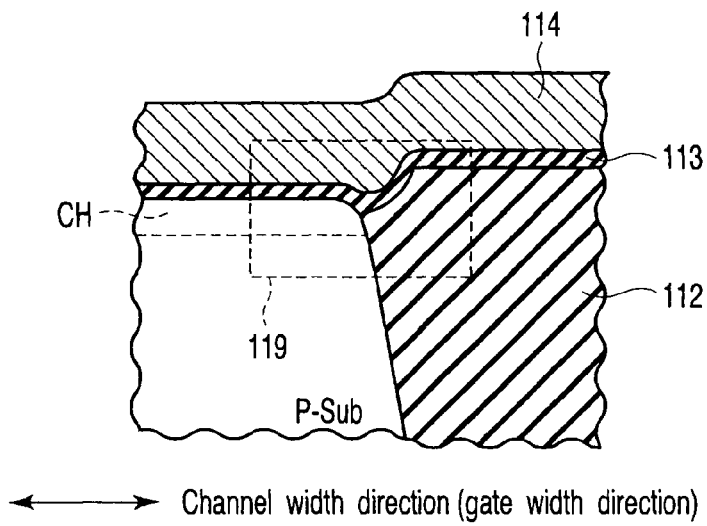
FIG. 19 is a cross-sectional view taken along line XIX-XIX' in FIG. 18.

As shown in FIG. 18 and FIG. 19, a semiconductor device 100 of the comparative example does not include the above-described first and second gate electrode extension portions 15-1 and 15-2 which are provided in a manner to cover both end portions of each of the source and drain regions in the channel length direction. Thus, both end portions of each of the source region S and drain region D in the channel width direction are formed from the device isolation insulating film 12 with no offset.

Consequently, at a corner portion 119 of the device region shown in FIG. 19, an active region AA is recessed, and the gate electrode 114 extends to the active region, thus causing concentration of an electric field from the gate electrode 114. As a result, such a reverse narrow channel effect occurs that turn-on occurs more easily than in the other part (central part) of the channel region. Further, a decrease in threshold value and an increase in off-leak occur due to, e.g. a decrease in dosage of the channel portion due to oxidation. In addition, positive charge is accumulated in the device isolation region, and a channel forms at an end part of the device region even when the gate 114 is turned off, leading to an increase in off-leak. Besides, with the development in microfabrication, as the channel width becomes narrower, the characteristics of the corner portion 119, where turn-on occurs, become more dominant. Thus, with the decrease in channel width, the threshold of turn-on of the transistor lowers.

It is necessary, therefore, to perform profile tuning of the diffusion layer, which is designed specifically for the peripheral transistor, and to improve the transistor characteristics.

However, since the peripheral transistor is formed at the same time as the memory cell, it is difficult to consistently and integrally perform the processes for the memory cell and peripheral transistor. Consequently, the number of additional processes, such as an ion implantation process which is performed specifically for the peripheral transistor, increases, and the manufacturing cost rises.

Besides, in the case where at the corner portion 119 the device isolation insulating film 112 is formed of polysilazane (PSZ: Partial Stabilized Zircon), the transistor characteristics disadvantageously degrade due to diffusion of a substance in the device isolation insulating film 112.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a device isolation insulating film which is buried in a semiconductor substrate;
   a gate insulation film which is provided on the semiconductor substrate;
   a gate electrode which is provided on the gate insulation film;
   a source region and a drain region which are provided in the semiconductor substrate and spaced apart from each other in a manner to sandwich the gate electrode, both end portions of each of the source region and the drain region being offset from the device isolation insulating film in a channel width direction by a predetermined distance;
   first and second gate electrode extension portions which are provided in a manner to cover both end portions of each of the source region and the drain region in a channel length direction; and
   wherein the first and second gate electrode extension portions cover an entirety of each of the source region and the drain region at said both end portions along the channel length direction.

2. The device according to claim 1, wherein the device isolation insulating film includes partial stabilized zircon.

3. The device according to claim 1, further comprising a gate electrode contact wiring provided on one of the first and second electrode extension portions.

4. The device according to claim 1, further comprising:
a memory cell array including a plurality of memory cells which are connected to a plurality of word lines and a plurality of bit lines; and
a word line control circuit which drives the word lines,
wherein the device according to claim 1 is a transfer transistor which is disposed in the word line control circuit.

5. The device according to claim 4, wherein the memory cell comprises:
a tunnel insulation film which is provided on the semiconductor substrate;
a charge accumulation layer which is provided on the tunnel insulation film;
an inter-gate insulation film which is provided on the charge accumulation layer; and
a control electrode layer which is provided on the inter-gate insulation film and is connected to the word line.

6. The device according to claim 4, further comprising a word line driving circuit which is connected to one end of a current path of the transfer transistor,
wherein the other end of the current path of the transfer transistor is electrically connected to the word line.

* * * * *